United States Patent
Chan et al.

(10) Patent No.: US 7,215,022 B2
(45) Date of Patent: May 8, 2007

(54) MULTI-DIE MODULE

(75) Inventors: Vincent Chan, Richmond Hill (CA); Samuel Ho, Toronto (CA)

(73) Assignee: ATI Technologies Inc., Markham (CA)

( * ) Notice: Subject to any disclaimer, the term of this patent is extended or adjusted under 35 U.S.C. 154(b) by 0 days.

(21) Appl. No.: 09/886,741

(22) Filed: Jun. 21, 2001

(65) Prior Publication Data

US 2002/0195704 A1    Dec. 26, 2002

(51) Int. Cl.
*H01L 23/34* (2006.01)

(52) U.S. Cl. .................. 257/724; 257/723; 257/787; 257/706; 257/685; 257/E25.023; 438/106; 438/107; 361/767

(58) Field of Classification Search ............... 257/724, 257/723, 731, 685, 778, 780, 784, 787, 706, 257/796, E25.023, 668, 698, 700, 707; 438/106, 438/107; 361/767
See application file for complete search history.

(56) References Cited

U.S. PATENT DOCUMENTS

| | | | |
|---|---|---|---|
| 4,951,232 A * | 8/1990 | Hannah | 345/422 |
| 5,424,573 A | 6/1995 | Kato et al. | |
| 5,475,264 A * | 12/1995 | Sudo et al. | 257/723 |
| 5,616,957 A | 4/1997 | Kajihara | |
| 5,642,262 A | 6/1997 | Terrill et al. | |
| 5,784,264 A * | 7/1998 | Tanioka | 361/803 |
| 5,807,791 A | 9/1998 | Bertin et al. | |
| 5,872,051 A * | 2/1999 | Fallon et al. | 438/616 |
| 5,872,700 A | 2/1999 | Collander | |
| 5,977,626 A | 11/1999 | Wang et al. | |
| 5,986,886 A | 11/1999 | Sasov | |
| 5,999,437 A | 12/1999 | Chengson et al. | |
| 6,069,793 A * | 5/2000 | Maruyama et al. | 361/687 |
| 6,075,289 A * | 6/2000 | Distefano | 257/732 |
| 6,157,080 A * | 12/2000 | Tamaki et al. | 257/738 |
| 6,208,525 B1 * | 3/2001 | Imasu et al. | 361/783 |
| 6,239,482 B1 | 5/2001 | Fillion et al. | |
| 6,294,731 B1 * | 9/2001 | Lu et al. | 174/35 R |
| 6,297,551 B1 | 10/2001 | Dudderar et al. | |
| 6,335,221 B1 | 1/2002 | Mess | |
| 6,376,907 B1 * | 4/2002 | Takano et al. | 257/704 |
| 6,392,896 B1 * | 5/2002 | Stoller | 361/760 |
| 6,414,385 B1 | 7/2002 | Huang et al. | |
| 6,437,984 B1 | 8/2002 | Chiu et al. | |
| 6,475,830 B1 * | 11/2002 | Brillhart | 438/109 |
| 6,608,763 B1 | 8/2003 | Burns et al. | |
| 6,618,267 B1 * | 9/2003 | Dalal et al. | 361/767 |

(Continued)

FOREIGN PATENT DOCUMENTS

EP    393 671 A2    10/1990

(Continued)

*Primary Examiner*—Kenneth Parker
*Assistant Examiner*—Chris C. Chu
(74) *Attorney, Agent, or Firm*—Vedder, Price, Kaufman & Kammhola, P.C.

(57) ABSTRACT

A multi-die module is electrically connected to both an unpackaged die and a packaged die as disclosed herein. The multi-die module has a footprint that is the same as conventional multi-die packages, which do not include packaged die, thereby allowing the multi-die module to be interchangeable with conventional multi-die packages. In one embodiment, the unpackaged die is a graphics processor, and the packaged die is a standard memory that has been burned in, functionally tested, and speed rated.

36 Claims, 5 Drawing Sheets

U.S. PATENT DOCUMENTS

| | | | |
|---|---|---|---|
| 6,630,727 B1 * | 10/2003 | Tutsch et al. | 257/668 |
| 6,703,698 B2 | 3/2004 | Huang et al. | |
| 6,734,552 B2 | 5/2004 | Combs et al. | |
| 6,849,940 B1 | 2/2005 | Chan et al. | |
| 2001/0008776 A1 | 7/2001 | Lai et al. | |
| 2002/0017721 A1 * | 2/2002 | Huang | 257/724 |
| 2002/0025608 A1 | 2/2002 | Shinonaga et al. | 438/127 |
| 2002/0074669 A1 * | 6/2002 | Watanabe et al. | 257/777 |
| 2002/0175421 A1 | 11/2002 | Kimura | |
| 2002/0195270 A1 | 12/2002 | Okubora et al. | |

FOREIGN PATENT DOCUMENTS

| | | |
|---|---|---|
| EP | 694 968 A2 | 1/1996 |
| EP | 849 800 A1 | 6/1998 |
| JP | 60-154648 | 8/1985 |
| JP | 62-281435 | 12/1987 |
| JP | 08-036034 | 9/1996 |

* cited by examiner

MULTI-DIE MODULE

FIELD OF THE DISCLOSURE

This application relates generally to semiconductor packaging, and more particularly to multiple die packages.

BACKGROUND

Various manufacturing and performance considerations often make it desirable to include more than one semiconductor die in a single package. However, by including more than one die in a single package, various testing problems arise. For example, since it is relatively expensive to test semiconductor die separately before they are packaged, manufacturers sometimes perform a minimal amount of testing on individual die before those die are placed into a multi-die package. Because the individual die are not tested before they are packaged, the die must be tested together after packaging. While testing the die together after packaging is usually less expensive than testing each die separately before packaging, when one of the die in the multi-die package is defective, the whole multi-die package must usually be scrapped, resulting in the loss of other good die in that package.

Another limitation of testing multiple die in a single package is that the more die within a single package, the more complex the testing becomes. This added complexity requires more complex test hardware, and can limit the ability to thorough-test some portions of one or more die within the multi-die package. It would be useful, therefore, to know that each die used in multi-die packages was fully functional, without having to rely on expensive pre-package die testing.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements for clarity. Further, where considered appropriate, reference numerals have been repeated among the Figures to indicate corresponding or analogous elements.

DETAILED DESCRIPTION OF THE FIGURES

In accordance with a specific embodiment of the present disclosure, a device including a multi-die module having a footprint size consistent with the footprint size of a standard package including only direct-attached semiconductor die is disclosed. The device includes both an unpackaged semiconductor die electrically connected to the multi-die module, and a packaged semiconductor die electrically connected to the multi-die module. In at least one embodiment, the unpackaged die is a graphics processor, and the packaged die is a memory die that has been previously burned in, functionally tested and speed rated. This multi-die module is advantageous over prior multi-die packages because by using tested and packaged devices, the problem of scrapping an entire multi-die package for a single bad die can be reduced. Various embodiments are described in greater detail with reference to FIGS. 1–9.

Figure 1:
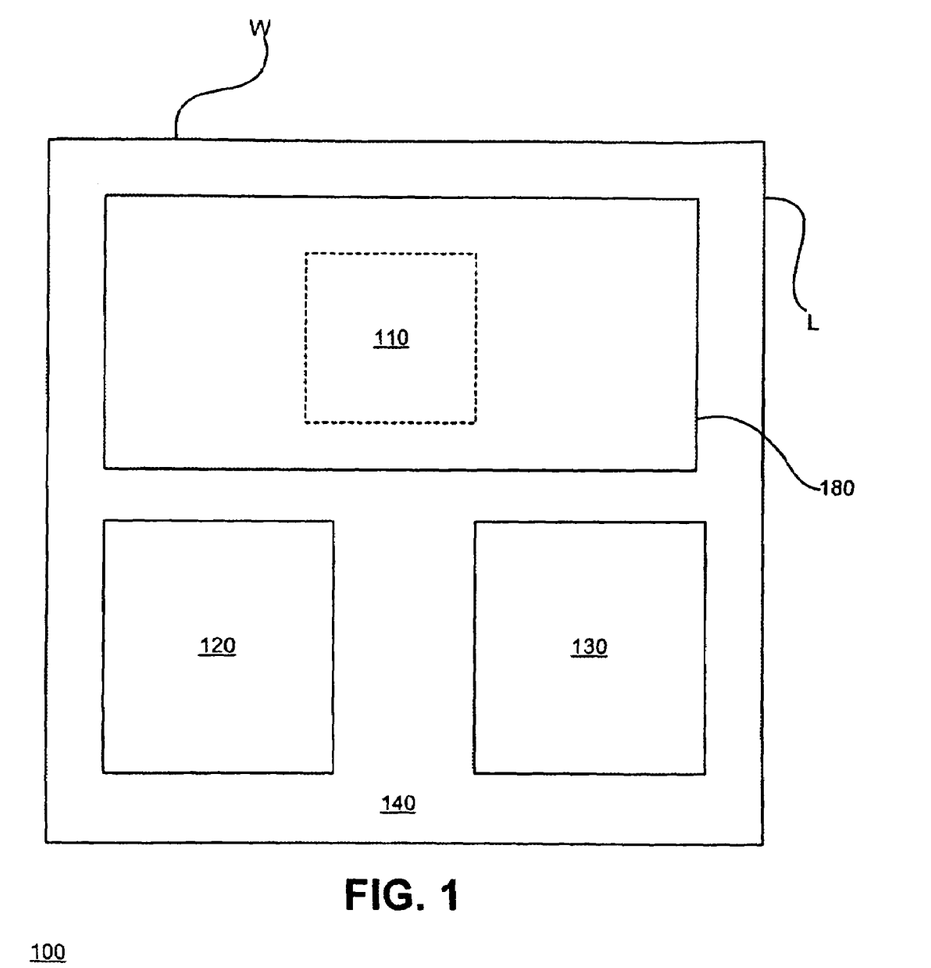
FIG. 1 is a diagram in planar view of a multi-die module according to one embodiment of the present disclosure.

Referring first to FIG. 1, a completed module for holding multiple semiconductor die is illustrated, and referred to generally as package module 100. Length dimension L and width dimension W are chosen so that package module 100 has a footprint that corresponds closely to the footprint of standard/conventional packages that are manufactured using one or more direct-attach (non-packaged) die. In addition, at least one embodiment of package module 100 is configured to have a ball grid array having a number and pitch of ball grid connections equivalent to standard packages. The term "standard packages" refers to those packages in common use, those packages identified and/or described by industry standards groups such as the Joint Electron Device Engineering Council (JEDEC), and/or those packages used on at least a semi-regular basis by industry participants. One example of a standard package is a 31×31 millimeter plastic ball grid array (PBGA). By using package sizes having standard footprints and/or array configurations, package module 100 can be used interchangeably in many circumstances with other packages, and is compatible with common handling equipment and manufacturing processes. In various embodiments, even though the footprint of package module 100 does not correspond exactly with a standard package size, it is consistent with conventional single and/or multi-die packages performing the same functions. Some examples of standard multi-die packages include ball grid array (BGA) packages having footprint sizes of 35 mm×35 mm, 31 mm×31 mm, 27 mm×27 mm, 37.5 mm×37.5 mm, 40 mm×40 mm, 42 mm×42 mm, and 42.5 mm×42.5 mm. It will be appreciated that package module 100 may have various combinations of length dimension L and width dimension W depending upon which the desired system in which package module 100 will be used.

It will be appreciated that often multiple direct-attach die are mounted on a standard package substrate which is used in other cases for only a single die. As used above and in the following disclosure and claims, the terms multi-die module or multi-die module substrate include in their meanings not only multi-die packages and substrates used exclusively for mounting more than one semiconductor die, but also substrates that are capable of being used to mount both single and multiple semiconductor die.

In the embodiment illustrated, package module 100 has unpackaged die 110 mounted on it, as well as packaged die 120 and 130. In at least one embodiment, unpackaged die 110 is a data processor, such as a general purpose processor or a graphics processor, and packaged die 120 and 130 are memory packaged in Chip Scale Packages (CSP) or stacked CSP memories. In other embodiments, unpackaged die 110 may be an additional processor such as an audio processor, a general purpose processor, a controller, etc., while packaged die 120 and 130 may be static random access memories (SRAM), dynamic random access memories (DRAM), read only memories (ROM), flash memories, electrically erasable programmable memories (EEPROMS), or any other suitable memory type or combination of types. In addition, packaged die 120 and 130 may be processors of the same or a different type than unpackaged die 110. Various embodiments of the present invention may employ different combinations of unpackaged semiconductor die 110 and packaged semicon ductor die 120 and 130, including the use of two unpackaged semiconductor die 110 and only one packaged semiconductor die 120, or multiple packaged semiconductor die 120 and 130 with no unpackaged semiconductor die 110.

Figure 2:
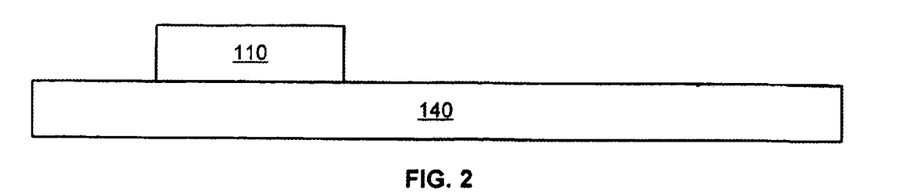
FIGS. 2–6 illustrate, in cross-sectional view, steps associated with the method of forming a package in accordance with one embodiment of the present disclosure.

FIG. 2 illustrates a partially completed multi-die module. Multi-die module substrate 140 is shown with unpackaged semiconductor die 110 attached in preparation for wire bonding. In one embodiment, multi-die module substrate 140 is a built up substrate having four to six layers. In another embodiment, multi-die module substrate 140 is a Bizmalemide Triazine (BT) substrate having two to six layers. It will be appreciated that any suitable substrate may be employed according to the teachings set forth herein.

Figure 3:
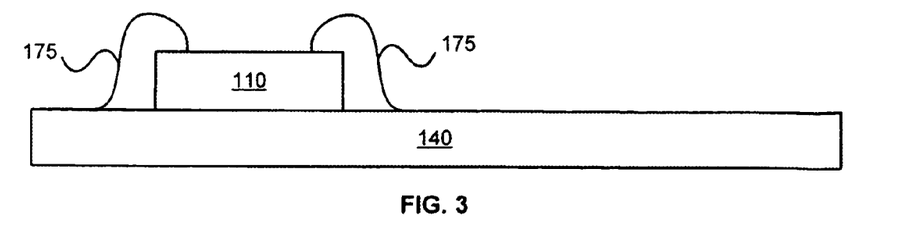

FIG. 3 illustrates the partially completed multi-die module of FIG. 2, but now bond wires 175 have been added to make an electrical connection between multi-die module substrate 140 and unpackaged semiconductor die 110. In at least one embodiment, bond wires 175 are made of a corrosion resistant material, such as gold, to resist corrosion, but other suitable wire types or similar means of electrical connection may be employed as desired.

Figure 4:
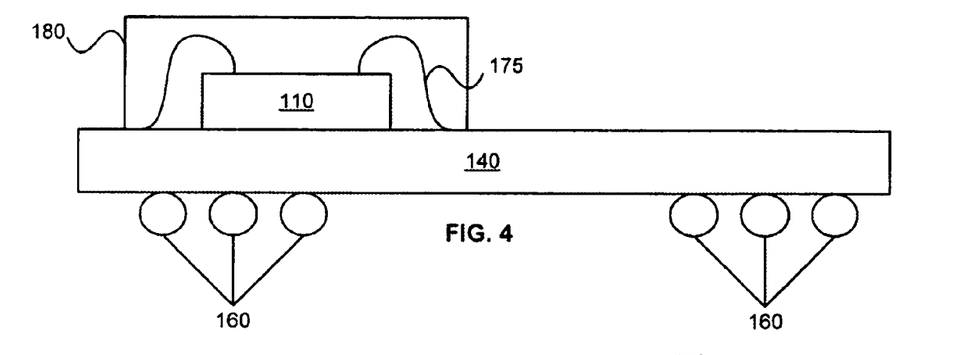

FIG. 4 illustrates the partially completed multi-die module of FIG. 3, after unpackaged semiconductor die 110 has been encapsulated with encapsulation material 180. Some examples of encapsulation material 180 are epoxy, metal cap or silicon coatings. Encapsulation material 180 may be dry molded or liquid molded depending on the type of encapsulation material desired. At this stage, solder balls 160 may be added to the bottom of multi-die module substrate 140 to provide for future connection of the completed package module 100 (FIG. 1) to a circuit board and/or other system. In order to facilitate interchangeability with many standard packages, solder balls 160 may have a pitch of 1.27 millimeters, 1.0 millimeters, 0.80 millimeters, 0.75 millimeters. or any other pitch suitable for a desired application. It will be appreciated that solder balls may be added at other suitable times during the manufacturing process.

Figure 5:
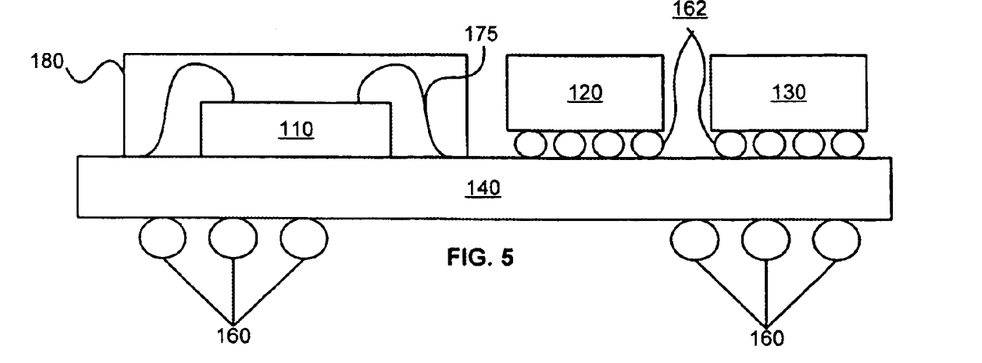

FIG. 5 shows packaged die 120 and 130 being attached to multi-die module substrate 140. In at least one embodiment, packaged die 120 and 130 are CSP memories or other packaged die manufactured for use with flip-chip or surface mount technology (SMT) reflow. In at least one embodiment, solder pads 162 have a pitch of 0.8 millimeters, but other suitable pitches, including 1 millimeter, 0.75 millimeters, etc. may be employed. By using package types suitable for use with SMT reflow, attachment and electrical connection are accomplished in a single step. If package types other than flip-chip type packages are used, other methods of attachment, such as those used in attaching unpackaged semiconductor die 110, may be employed as necessary. At this point, the manufacture of package module 100 (FIG. 1) may be complete.

Figure 6:
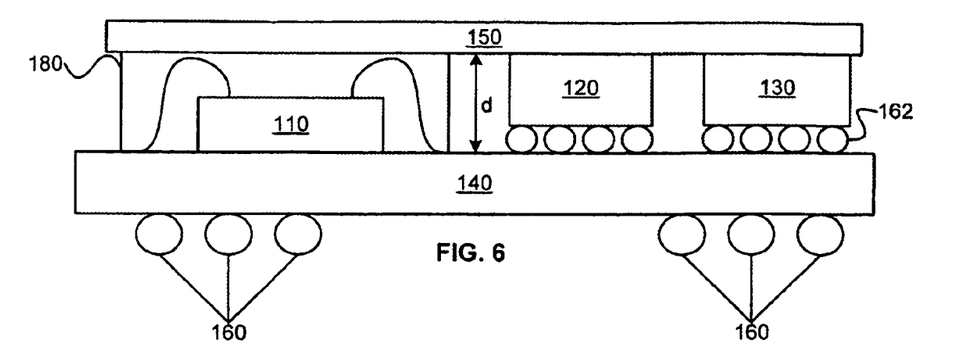

FIG. 6 illustrates a heat sink 150 added on top of unpackaged semiconductor die 110 and packaged die 120 and 130 to aid in removing heat from the circuits. As illustrated, the distance "d" from the top of multi-die module substrate 140 to the top of packaged die 120 and 130 is substantially equal to the distance from the top of multi-die module substrate 140 to the top of the encapsulation material over unpackaged semiconductor die 110, which is referred to herein as the top of unpackaged semiconductor die 110. In at least one embodiment, distance "d" is about 1.3 millimeters. Making these distances the same facilitates effective use of heat sink 150, although heat sink 150 could be fabricated to account for any difference between the heights of various packaged and/or unpackaged die attached or mounted to multi-die module substrate 140. In various embodiments, heat sink 150 may be a thin strip of heat conductive material, a large heat sink with fins for added heat dissipation, or any other suitable type of heat sink.

Figure 7:
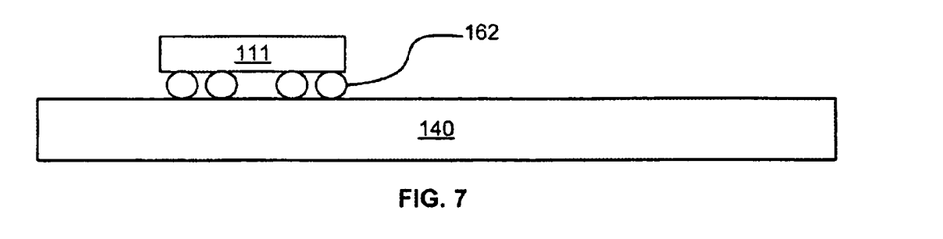
FIGS. 7–9 illustrate, in cross-sectional view, steps associated with the method of forming a package in accordance with another embodiment of the present disclosure.

FIG. 7 illustrates an alternate method of attaching unpackaged semiconductor die 111 to multi-die module substrate 140. Unpackaged semiconductor die 111 illustrated in FIG. 7 differs from unpackaged semiconductor die 110 (FIGS. 2–6) only in that unpackaged semiconductor die 111 is manufactured for use with flip-chip technology instead of wire-bond technology. Consequently, unpackaged semiconductor die 111 includes solder pads 162, which as previously discussed, serve to both a physically attach and electrically connect unpackaged semiconductor die 111 to multi-die module 140.

Figure 8:
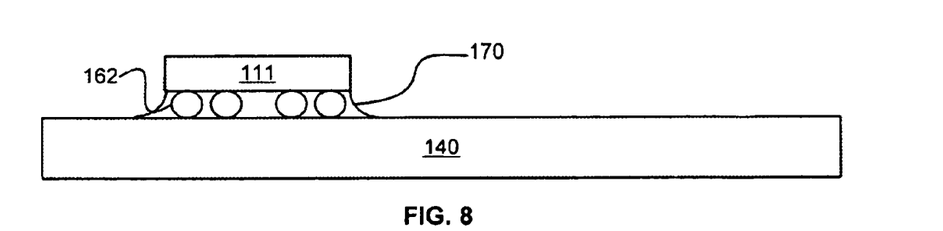

FIG. 8 illustrates another method of insulating electrical connections between unpackaged semiconductor die 111 and multi-die module substrate 140. Since all of the electrical connections are underneath unpackaged semiconductor die 111, there is no need for total encapsulation of unpackaged semiconductor die 111 to protect the electrical connections. Consequently, unpackaged semiconductor die 111 is underfilled with underfill material 170. Underfill material 170 may include, but is not limited to, ASEUA03 and ASEUA04 types of underfill materials.

Figure 9:
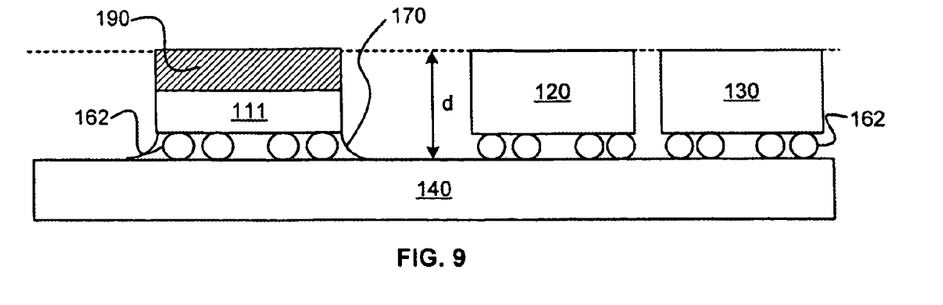

FIG. 9 shows packaged die 120 and 130 attached as already discussed. Note however, that the top of unpackaged semiconductor die 111 is not level with the tops of packaged die 120 and 130. Therefore, shim 190 is used to effectively raise the top of unpackaged die 111 to be even with the tops of packaged die 120 and 130, and thereby facilitate the use of a heat sink (not shown). Shim 190 may be composed of silicon, or another suitable heat conveying material. It will be appreciated that a shim such as shim 190 may be used on top of packaged die 120 and/or 130, instead of or in addition being used on top of unpackaged die 111 if needed.

Figure 10:
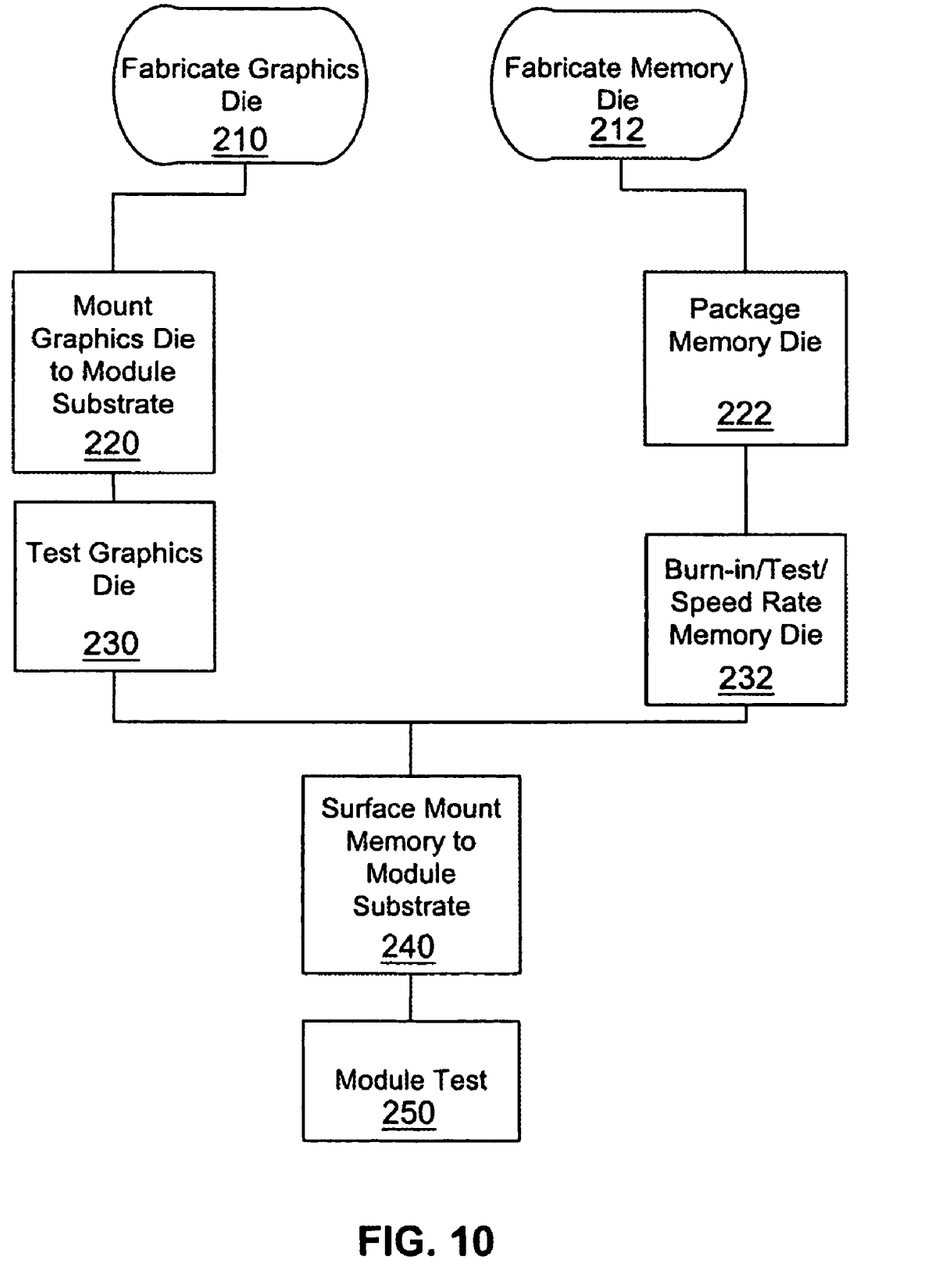

FIG. 10 is a flowchart illustrating a method according to one embodiment of the present disclosure. It will be appreciated that some of the steps illustrated may be performed concurrently, or in a different order than illustrated without departing from the spirit and scope of the teachings set forth herein. In step 210, what will be the direct-attach/unpackaged die is fabricated, and prepared for use. In the embodiment illustrated, this die is a graphics chip die. The graphics die is then mounted to a multi-die module substrate using flip-chip, wire-bond, or another suitable process during step 220. It is also during this step that electrical connections are made, the die is encapsulated or underfilled, and solder balls are attached to the bottom of the multi-die module substrate to facilitate testing of the graphics die. The method then proceeds to step 230, in which the graphics die is tested. Note that by testing the graphics die at this point, a test fixture for use with packaged die can be used. Also, if the graphics die is bad, then no other die are lost. It will be noted that in at least one embodiment, all connections required for testing of the graphics die are connected to pins on the package.

In one embodiment, at the same time steps 210–230 are being performed, steps 212–232 are also being performed. What will become a packaged die, in this illustration a memory die, is fabricated in step 212. The memory die is then packaged in step 222. It will be appreciated that various wire-bond or flip-chip mounting methods similar to those discussed earlier may be used to package the memory die. Once the memory die is packaged in step 222, the packaged memory die is burned in, tested and speed rated in step 232.

By the time step 240 is started, there is a known good graphics die on the multi-die module substrate, and a known good packaged memory die. The packaged memory die is then surface mounted to the multi-die module substrate in step 240, and the entire multi-die memory module is tested in step 250.

Figure 11:
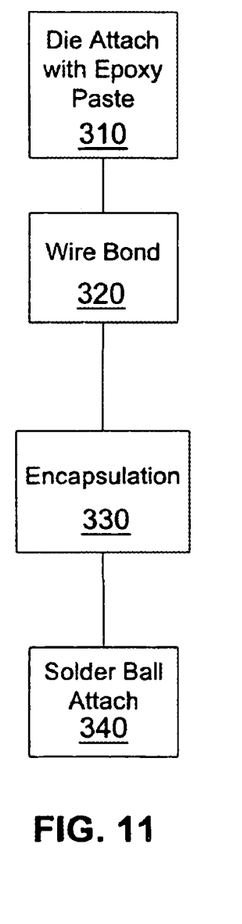

Referring now to FIGS. 10 and 11, step 220 of FIG. 10 will be discussed in greater detail for the case in which the graphics die is to be electrically connected to the multi-die module substrate using wire-bonding techniques. First, the die is secured to the multi-die substrate using an adhesive, for example epoxy paste in step 310. The epoxy paste can be either an electrically conductive adhesive, such as AbleStik 8355F, or a non-conductive adhesive, such as QMI536. Then in step 320, wires are connected between the graphics die and the multi-die module substrate using standard wire bonding techniques. Once the graphics die has been physically attached and electrically connected to the multi-die module substrate, the graphics die and the wires connecting the die to the substrate are encapsulated in step 330. As noted earlier, encapsulation may include a dry encapsulation process, a liquid encapsulation process, or other suitable encapsulation process. After the graphics die is encapsulated, solder balls are formed on the bottom of the substrate to aid in testing the graphics die, and for later connection to a printed circuit board or other system component. It will be appreciated that if it is desired to use connection means other than SMT reflow to connect the completed multi-die module to an external system, then other commonly known connections can be formed on the multi-die module, and the solder balls may be attached to the multi-die module substrate at a different point in the manufacturing process if desired.

Figure 12:
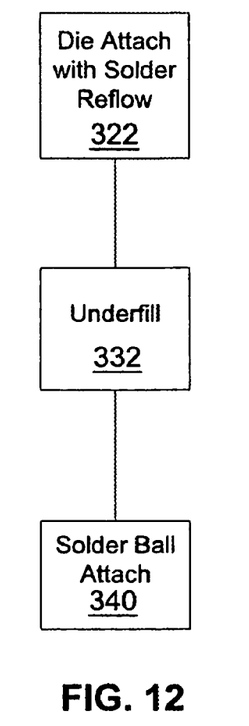

Referring now to FIGS. 10 and 12, step 220 of FIG. 10 will be discussed in greater detail for the case in which the graphics die is to be electrically connected to the multi-die module substrate using flip-chip techniques. In step 322, the graphics die is attached using a solder reflow technique such as is commonly used in flip-chip or SMT applications. Using a reflow technique provides both physical attachment and electrical connection. Next, step 332 is performed, in which the area under the graphics die and between the electrical connections is underfilled. At this point, step 340 is performed to form solder balls on the under-side of the multi-die module.

Figure 13:
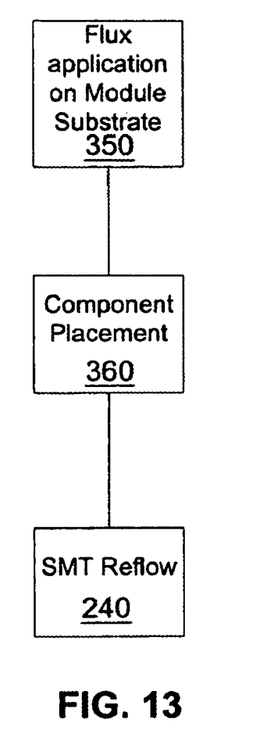

Lastly, referring to FIGS. 10 and 13, step 240 of FIG. 10 is more fully discussed. The steps of FIG. 13 are performed after the graphics die has already been installed into the multi-die module, and tested. These steps are used to perform the connection of packaged die such as CSP memories onto to the multi-die module substrate. In step 350, flux or solder paste is applied to the portion of the multi-die module substrate on which the packaged memory die is to be mounted to facilitate solder melting at lower temperatures and the formation of strong, reliable solder joints. In the next step, step 360, the packaged memory die is placed onto the multi-die module substrate in preparation for SMT reflow in step 240. In at least one embodiment, SMT reflow is performed at a maximum of 225° degrees centigrade to prevent damage to other components and/or connections due to excessive heat. The maximum temperature may change if the material used for the solderballs changes. For example, a maximum temperature of about 260 degrees Centigrade may be required if lead free solder is used.

In the preceding detailed description, FIGS. 1–13 have been used to teach a multi-die module that is electrically connected to both an unpackaged die, such as a graphics processor and a packaged die, such as a CSP memory. The multi-die module has a footprint that is the substantially the same as conventional multi-die packages, which do not include packaged die, thereby allowing the multi-die module to be interchangeable with conventional multi-die packages. A multi-die module as disclosed herein has the advantage of decreasing the likelihood that good die in a multi-die configuration will have to be scrapped. A multi-die module constructed according to the teachings set forth herein has the further advantage of facilitating thorough testing without the added costs imposed by equipment needed to test individual die outside of a package. Various techniques for making physical and electrical connections between the die and the multi-die module have been discussed with sufficient specificity to allow one skilled in the art to practice the teachings set forth herein without undue experimentation.

Accordingly, the specification and figures herein are to be regarded in an illustrative rather than in a restrictive sense, and all such modifications and their equivalents are intended to be included within the scope of the present invention. Benefits, other advantages, and solutions to problems have been described above with regard to specific embodiments. However, the benefits, advantages, solutions to problems, and any elements that may cause any benefit, advantage, or solution to occur or become more pronounced are not to be construed as critical, required, or essential features or elements of any or all of the claims.

What is claimed is:

1. A device comprising:
   a package module including a substrate having a standard package footprint;
   an unpackaged semiconductor die directly attached to the package module, the unpackaged semiconductor die encapsulated onto the package module in a structure having a planar top surface; and
   a separately pre-packaged semiconductor die having a top surface and attached to the package module;
   wherein the planar top surface of the encapsulated structure and the top surface of the pre-packaged semiconductor die are of equal distance from the substrate.

2. The device as in claim 1, wherein the pre-package semiconductor is packaged in a ball grid array package.

3. The device as in claim 1, wherein the unpackaged semiconductor die is a graphics processor.

4. The device as in claim 1, wherein the pre-packaged semiconductor is a memory.

5. The device as in claim 1, wherein a plurality of pre-packaged semiconductor are attached to the package module.

6. The device as in claim 1, wherein the unpackaged semiconductor die is wire bonded to the package module.

7. The device as in claim 1, wherein attached includes surface-mount technology reflow.

8. The device as in claim 1, wherein the encapsulated structure has a footprint greater than the footprint of the unpackaged semiconductor die.

9. The device as in claim 8, wherein the encapsulated semiconductor die forms a substantially rectangular structure on the package module.

10. The device as in claim 1, wherein the footprint size of the package module is one of 35 mm×35 mm, 31 mm×31 mm, 27 mm×27 mm, 37.5 mm×37.5 mm, 40 mm×40 mm, 42 mm×42 mm, or 42.5mm×42.5 mm.

11. The device as in claim 1, further including a heat sink.

12. The device in claim 11, wherein a top surface of the unpackaged semiconductor die and a top surface of the pre-packaged semiconductor are of substantially equal distance from a surface of the package module.

13. The device of claim 1, further including a planar heat sink adapted to engage the encapsulated structure and the top surface of the pre-packaged semiconductor.

14. The device of claim 1 wherein said unpackaged semiconductor die is at least partially encapsulated on the package module.

15. A device comprising:
a package module sized to be interchangeable with standard package sizes;
a graphics-processing die directly attached to the package module, the graphics-processing die encapsulated on the package module in a structure having a planar top surface; and
a separately pre-packaged memory die having a top surface and attached to the package module;
wherein the planar top surface of the encapsulated structure and the top surface of the pre-packaged memory die are of equal distance from the package module.

16. The device as in claim 15, wherein the graphics processing die is wire bonded to the package module.

17. The device as in claim 15, wherein a plurality of pre-packaged memory die are attached to the package module.

18. The device as in claim 15, wherein directly attached includes the graphics processing die being wire bonded to the package module.

19. The device as in claim 15, wherein attached includes surface-mount technology reflow.

20. The device as in claim 15, wherein the standard package sizes include one of 35 mm×35 mm, 31 mm×31 mm, 27 mm×27 mm, 37.5 mm×37.5 mm, 40 mm×40 mm, 42 mm×42 mm, or 42.5 mm×42.5 mm.

21. The device as in claim 15, further including a heat sink.

22. The device in claim 21, wherein a top surface of the graphics-processor die and a top surface of the pre-packaged memory die are of substantially equal distance from a surface of the package module.

23. The device of claim 15 wherein said graphics-processing die is at least partially encapsulated on the package module.

24. A multi-die module, comprising:
a substrate having a first surface and a second surface;
an unpackaged semiconductor die mounted to the first surface of the substrate, the semiconductor die encapsulated in a structure having a planar top surface; and
a separately pre-packaged semiconductor die having a top surface and mounted on the first surface of the substrate;
wherein the planar top surface of the encapsulated structure and the top surface of the pre-packaged semiconductor die are of equal distance from the substrate.

25. The multi-die module as in claim 24, further including a second pre-packaged semiconductor die mounted on the first surface of the substrate.

26. The multi-die module as in claim 24, further including a plurality of unpackaged semiconductor die mounted on the first surface of the substrate.

27. The multi-die module as in claim 24, wherein the unpackaged semiconductor die is mounted to the first surface of the substrate by wire bonding.

28. The multi-die module as in claim 24, wherein the encapsulating structure is further comprised of an encapsulating material including epoxy, metal cap or silicon coatings.

29. The multi-die module as in claim 24, further including a heat sink.

30. The multi-die module as in claim 24, wherein the unpackaged semiconductor die is a graphics processor.

31. The multi-die module as in claim 24, wherein the pre-packaged semiconductor die is a memory.

32. The multi-die module of claim 24 wherein the unpackaged semiconductor die is at least partially encapsulated in a structure having a planar top surface.

33. A multi-die module, comprising:
a substrate having a first surface;
an unpackaged semiconductor die mounted to the first surface of the substrate, the semiconductor die encapsulated in a structure having planar top surface; and
a separately pre-packaged semiconductor die on the first surface of the substrate, wherein the encapsulating structure is further comprised of an encapsulating material of a metal cap; wherein the planar top surface of the encapsulated structure and the top surface of the pre-packaged semiconductor die are of equal distance from the substrate.

34. The multi-die module of claim 33 wherein the unpackaged semiconductor die is at least partially encapsulated.

35. A multi-die module, comprising:
a substrate having a first surface;
an unpackaged semiconductor die mounted to the first surface of the substrate, the semiconductor die encapsulated in a structure having a planar top surface, and
a separately pre-packaged semiconductor die having a top surface and mounted on the first surface, of the substrate;
wherein the planar top surface of the encapsulated structure and the top surface of the pre-packaged semiconductor die are of equal distance from the substrate.

36. The multi-die module of claim 35 wherein the unpackaged semiconductor die is at least partially encapsulated.

* * * * *

UNITED STATES PATENT AND TRADEMARK OFFICE
CERTIFICATE OF CORRECTION

| | | |
|---|---|---|
| PATENT NO. | : 7,215,022 B2 | Page 1 of 1 |
| APPLICATION NO. | : 09/886741 | |
| DATED | : May 8, 2007 | |
| INVENTOR(S) | : Vincent Chan et al. | |

It is certified that error appears in the above-identified patent and that said Letters Patent is hereby corrected as shown below:

Column 1, line 46, in the following paragraph:

--FIGS. 10-13 are flow diagrams illustrating steps of various methods according to the present disclosure.--

Signed and Sealed this
Fourteenth Day of June, 2011

David J. Kappos
*Director of the United States Patent and Trademark Office*